(12) United States Patent
Kishimoto et al.

(10) Patent No.: US 11,784,629 B2
(45) Date of Patent: Oct. 10, 2023

(54) PIEZOELECTRIC DEVICE

(71) Applicant: Murata Manufacturing Co., Ltd., Nagaokakyo (JP)

(72) Inventors: Yutaka Kishimoto, Nagaokakyo (JP); Shinsuke Ikeuchi, Nagaokakyo (JP); Katsumi Fujimoto, Nagaokakyo (JP); Tetsuya Kimura, Nagaokakyo (JP); Fumiya Kurokawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 391 days.

(21) Appl. No.: 17/161,727

(22) Filed: Jan. 29, 2021

(65) Prior Publication Data
US 2021/0152149 A1    May 20, 2021

Related U.S. Application Data

(63) Continuation of application No. PCT/JP2019/023737, filed on Jun. 14, 2019.

(30) Foreign Application Priority Data

Jul. 30, 2018    (JP) .................. 2018-142876

(51) Int. Cl.
*H03H 9/17*    (2006.01)
*H03H 3/02*    (2006.01)
(Continued)

(52) U.S. Cl.
CPC .............. *H03H 9/174* (2013.01); *H03H 3/02* (2013.01); *H03H 9/02031* (2013.01);
(Continued)

(58) Field of Classification Search
CPC .............. H03H 9/174; H03H 9/02031; H03H 9/02228; H03H 9/13; H03H 9/176
See application file for complete search history.

(56) References Cited

U.S. PATENT DOCUMENTS 9,337,800 B1 * 5/2016 Olsson, III ............... H03H 9/17
2003/0062807 A1 * 4/2003 Takeuchi .............. B81B 3/0035
310/358

(Continued)

FOREIGN PATENT DOCUMENTS

JP    07-206600 A    8/1995
JP    2007-267109 A    10/2007
(Continued)

OTHER PUBLICATIONS

English Translation of JP 2017224969 (Year: 2017).*
Official Communication issued in International Patent Application No. PCT/JP2019/023737, dated Jul. 30, 2019.

*Primary Examiner* — Bryan P Gordon
(74) *Attorney, Agent, or Firm* — KEATING & BENNETT, LLP

(57) ABSTRACT

A piezoelectric device includes a membrane portion and a piezoelectric layer made of single crystal of a piezoelectric body. At least a portion of the piezoelectric layer is included in the membrane portion. An electrode is provided on a surface of the piezoelectric layer in the membrane portion. The piezoelectric layer includes a first polarization region in a first polarization state and a second polarization region in a second polarization state, and the first polarization region and the second polarization region are spaced apart from each other in a thickness direction or an in-plane direction.

18 Claims, 6 Drawing Sheets

(51) Int. Cl.
*H03H 9/02* (2006.01)
*H03H 9/13* (2006.01)

(52) U.S. Cl.
CPC .......... *H03H 9/02228* (2013.01); *H03H 9/13* (2013.01); *H03H 9/176* (2013.01); *H03H 2003/023* (2013.01)

(56) References Cited

U.S. PATENT DOCUMENTS

| | | | |
|---|---|---|---|
| 2005/0035829 A1* | 2/2005 | Umeda | H03H 9/174 |
| | | | 333/191 |
| 2007/0227333 A1 | 10/2007 | Higuchi et al. | |
| 2016/0156332 A1 | 6/2016 | Umeda | |
| 2017/0069821 A1 | 3/2017 | Mouri et al. | |
| 2018/0041189 A1 | 2/2018 | Lee et al. | |
| 2018/0069168 A1* | 3/2018 | Ikeuchi | H10N 30/40 |

FOREIGN PATENT DOCUMENTS

| | | |
|---|---|---|
| JP | 2010-093598 A | 4/2010 |
| JP | 2017-224969 A | 12/2017 |
| JP | 2018-023082 A | 2/2018 |
| WO | 2015/025716 A1 | 2/2015 |
| WO | 2015/190322 A1 | 12/2015 |
| WO | 2016/175013 A1 | 11/2016 |

\* cited by examiner

PIEZOELECTRIC DEVICE

CROSS REFERENCE TO RELATED APPLICATIONS

This application claims the benefit of priority to Japanese Patent Application No. 2018-142876 filed on Jul. 30, 2018 and is a Continuation Application of PCT Application No. PCT/JP2019/023737 filed on Jun. 14, 2019. The entire contents of each application are hereby incorporated herein by reference.

BACKGROUND OF THE INVENTION

1. Field of the Invention

The present invention relates to a piezoelectric device.

2. Description of the Related Art

Vibrators which have a unimorph structure or a bimorph structure and are used for a clock oscillator, a piezoelectric buzzer, or the like have been developed. Related techniques are described in Japanese Unexamined Patent Application Publication No. 2007-267109 and International Publication No. WO2015/025716, for example. Aluminum nitride (AlN), lead zirconate titanate (PZT), or the like is used as a piezoelectric body.

Japanese Unexamined Patent Application Publication No. 2018-23082 describes a state of a surface of a piezoelectric body observed with a scanning electron microscope (SEM) and a state of a boundary between an electrode and the piezoelectric body observed with a transmission electronic microscope (TEM).

A piezoelectric body, such as AlN and PZT, is formed above a surface of a silicon substrate with an oxide layer interposed therebetween, and such a piezoelectric body layer is formed by sputtering or other methods to be a polycrystalline layer. Such a piezoelectric body layer thus formed has inconsistencies in polarization states. The pictures obtained with the SEM and the TEM in Japanese Unexamined Patent Application Publication No. 2018-23082 show that the piezoelectric body is polycrystalline and polarization directions thereof are not completely the same unlike a single crystal substrate.

SUMMARY OF THE INVENTION

Preferred embodiments of the present invention provide piezoelectric devices that each control a polarization state and thus control piezoelectricity so as to control and improve device characteristics.

A piezoelectric device according to a preferred embodiment of the present invention includes a membrane portion and a piezoelectric layer made of single crystal of a piezoelectric body. At least a portion of the piezoelectric layer is included in the membrane portion. An electrode is provided on a surface of the piezoelectric layer in the membrane portion. The piezoelectric layer includes a first polarization region in a first polarization state and a second polarization region in a second polarization state, and the first polarization region and the second polarization region are spaced apart from each other in a thickness direction or an in-plane direction.

According to preferred embodiments of the present invention, device characteristics can be improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
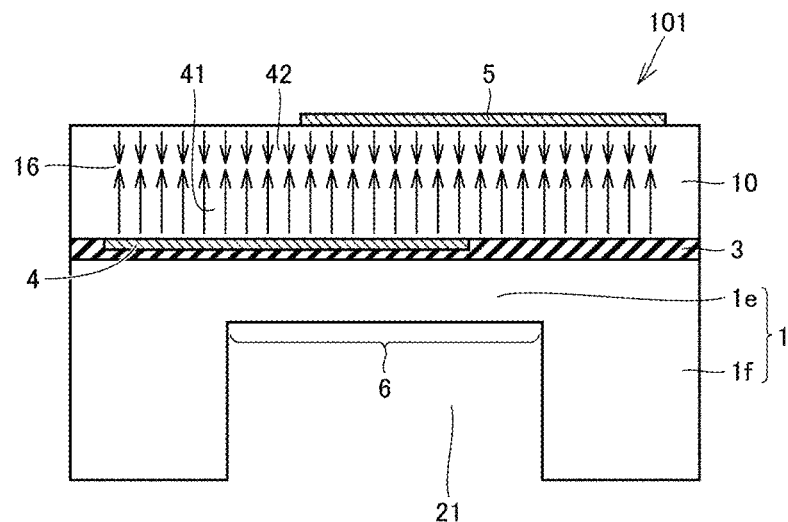
FIG. 1 is a sectional view of a piezoelectric device according to Preferred Embodiment 1 of the present invention.

Preferred embodiments of the present invention will be described in detail with reference to the accompanying drawings. The drawings do not always show dimensional ratios corresponding to the actual ratios, and sometimes show an exaggerated dimensional ratio for the sake of convenience in description. Reference to up or down mentioned in the following description does not always mean absolute up or down but sometimes means relative up or down in a posture illustrated in the drawings.

Preferred Embodiment 1

Figure 2:
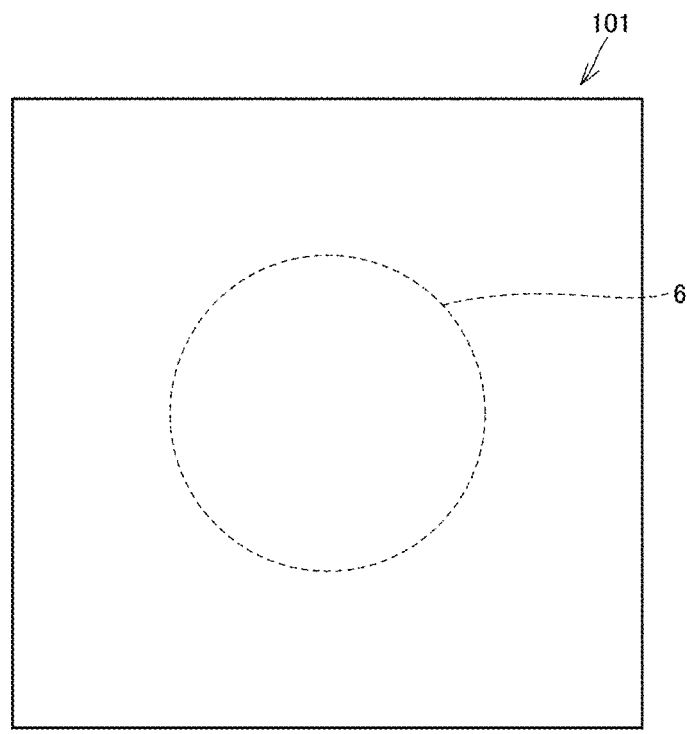
FIG. 2 is a plan view of the piezoelectric device according to Preferred Embodiment 1 of the present invention.

A piezoelectric device according to Preferred Embodiment 1 of the present invention will be described with reference to FIGS. 1 and 2. FIG. 1 is a sectional view illustrating a piezoelectric device 101 according to the present preferred embodiment. FIG. 2 is a plan view of the piezoelectric device 101. The piezoelectric device 101 includes a substrate 1. The substrate may preferably be, for example, a silicon substrate. The piezoelectric device 101 includes a membrane portion 6. The membrane portion 6 is a deformable thin portion in the piezoelectric device 101. In the example illustrated in FIG. 1, the substrate 1 includes a thin portion 1e and a thick portion 1f. The thin portion 1e is thinner than the thick portion 1f and is deformable. Viewed from a position directly underneath in FIG. 1, the thin portion 1e is surrounded by the thick portion 1f. In the example illustrated in FIG. 1, the membrane portion 6 includes the thin portion 1e. The thin portion 1e is surrounded by the thick portion 1f, and the substrate 1 accordingly includes a space 21.

The piezoelectric device 101 includes a piezoelectric layer 10 made of single crystal of a piezoelectric body. The "piezoelectric body" described here may preferably be any of $LiTaO_3$, $LiNbO_3$, $ZnO$, and PMN-PT, for example. At least a portion of the piezoelectric layer 10 is included in the membrane portion 6. In the membrane portion 6, an electrode is provided on a surface of the piezoelectric layer 10. In this example, an upper electrode 5 is the electrode on the upper surface of the piezoelectric layer 10. A lower electrode 4 is provided on the lower surface of the piezoelectric layer 10 over the thick portion 1f and the thin portion 1e. The lower electrode 4 may be embedded in an intermediate layer 3 which is described later.

The piezoelectric layer 10 includes a first polarization region 41 which is in a first polarization state and a second polarization region 42 which is in a second polarization state. The first polarization region 41 and the second polarization region 42 spaced apart from each other in a thickness direction or an in-plane direction. In the example illustrated in FIG. 1, the first polarization region 41 and the second polarization region 42 are spaced apart from each other in the thickness direction with an interface 16 as a boundary.

The intermediate layer 3 is interposed between the substrate 1 and the piezoelectric layer 10. The intermediate layer 3 is an insulating layer. The intermediate layer 3 may preferably be made of $SiO_2$, for example. The intermediate layer 3 may include a plurality of layers. The intermediate layer 3 may include a metal layer. In the example illustrated in FIG. 1, the membrane portion 6 includes a portion of the piezoelectric layer 10 and a portion of the intermediate layer 3, in addition to the thin portion 1e of the substrate 1.

In the present preferred embodiment, the piezoelectric layer 10 is able to strain by applying a potential difference between the upper electrode 5 and the lower electrode 4. The piezoelectric device 101 is preferably, for example, a piezoelectric micromachined ultrasonic transducer (PMUT) utilizing flexural vibration. In the example described here, a lower portion below the interface 16 is the first polarization region 41 and an upper portion above the interface 16 is the second polarization region 42. Directions of polarization are opposite to each other in the first polarization state and the second polarization state. That is, the directions of polarization are opposite to each other between the first polarization region 41 and the second polarization region 42. Here, a polarization state can be determined by observing a cross section of a thin film with a scanning nonlinear dielectric microscope (SNDM), a piezoelectric response microscope (PRM), a friction force microscope (FFM), or the like, for example.

In the example described here, the membrane portion 6 is preferably circular or substantially circular in a plan view as illustrated in FIG. 2. However, the shape of the membrane portion in a plan view is not limited to circular or substantially circular, and may be square or substantially square, rectangular or substantially rectangular, of polygonal or substantially polygonal, for example. Although the upper electrode 5 is actually provided in a certain pattern on the upper surface of the piezoelectric layer 10, the upper electrode 5 is not illustrated in FIG. 2. The piezoelectric device 101 which includes no slits is described as an example, but one or more slits may be provided inside the membrane portion 6 in a plan view. The slits may be intermittently provided along the contour line of the membrane portion 6 in a plan view, for example.

In the piezoelectric device 101 according to the present preferred embodiment, the piezoelectric layer 10 includes the first polarization region 41 in the first polarization state and the second polarization region 42 in the second polarization state. Since the first polarization region 41 and the second polarization region 42 are spaced apart from each other in the thickness direction or the in-plane direction, device characteristics can be improved. When the piezoelectric device is used, for example, as a PMUT, a desired value of sound pressure can be obtained by adjusting the position of the interface 16 in the thickness direction.

In the present preferred embodiment, a polarization state is controlled to control piezoelectricity, and thus device characteristics are controlled and improved.

The present preferred embodiment has exemplified the configuration in which the substrate 1 includes the thin portion 1e and the membrane portion 6 includes the thin portion 1e. However, a configuration in which the substrate 1 does not include the thin portion 1e may be provided. In other words, a configuration in which the thickness of the thin portion 1e is zero may be provided. In this configuration, the membrane portion 6 is configured not to include the thin portion 1e of the substrate 1. In this configuration, the membrane portion 6 similarly includes a portion of the piezoelectric layer 10 and a portion of the intermediate layer 3. The intermediate layer 3 may be exposed to the lower surface of the membrane portion 6.

In the example illustrated in FIG. 1, the interface 16 is preferably on the same or substantially the same plane in a surface direction of the piezoelectric layer 10, but the configuration is not limited to this. That is, the interface 16 does not have to be entirely on the same plane. A portion of the interface 16 may be shifted in the thickness direction inside the piezoelectric layer 10.

As described in the present preferred embodiment, the first polarization region 41 and the second polarization region 42 are preferably spaced apart from each other in the thickness direction of the piezoelectric layer 10 and the interface 16 between them is preferably close to an electrode. The interface 16 is preferably close to the upper electrode 5, for example. This configuration advantageously improves device characteristics.

As described in the present preferred embodiment, a piezoelectric body defining the piezoelectric layer 10 is preferably LiTaO$_3$ or LiNbO$_3$, for example. This configuration improves the advantageous effect in controlling a polarization state.

As described in the present preferred embodiment, the membrane portion 6 preferably performs flexural vibration. This configuration advantageously functions to appropriately control sound pressure and a frequency.

Figure 3:
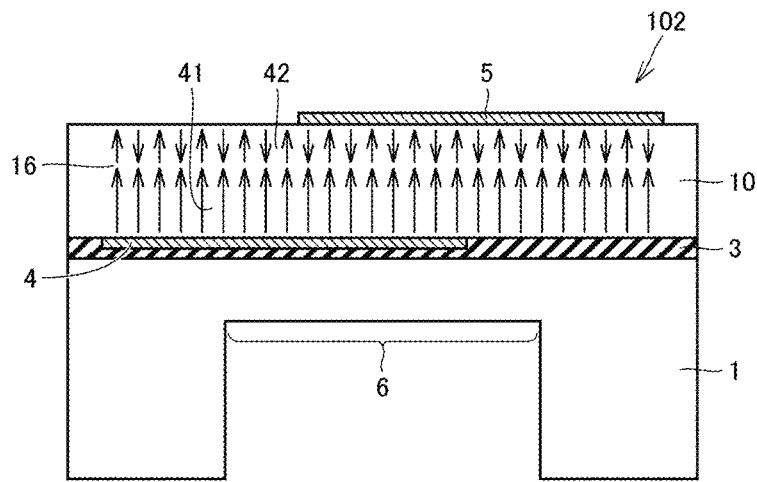
FIG. 3 is a sectional view of a first modification of the piezoelectric device according to Preferred Embodiment 1 of the present invention.

Here, a piezoelectric device 102 illustrated in FIG. 3 may be provided. In the piezoelectric device 102, a direction of polarization is in an upward direction in the first polarization region 41 below the interface 16, while directions of polarization are mixed in an upward direction and a downward direction in the second polarization region 42 above the interface 16.

Figure 4:
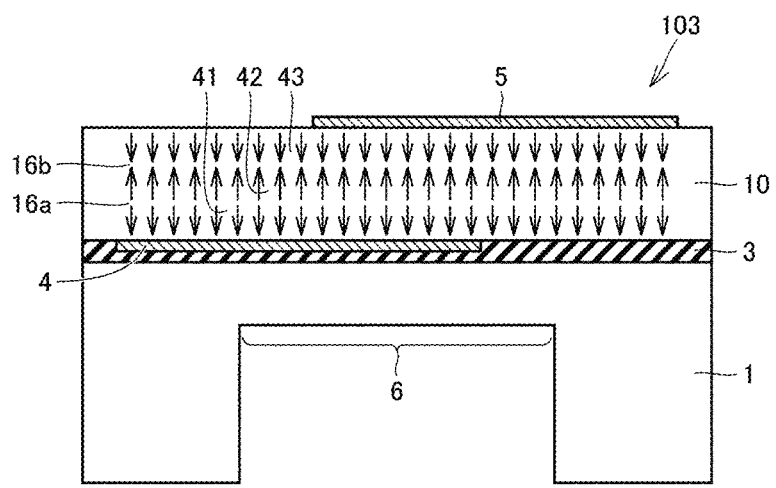
FIG. 4 is a sectional view of a second modification of the piezoelectric device according to Preferred Embodiment 1 of the present invention.

A piezoelectric device 103 illustrated in FIG. 4 may be provided. In the piezoelectric device 103, the piezoelectric layer includes two interfaces 16a and 16b in the middle in the thickness direction of the piezoelectric layer 10. Directions of polarization change at the interfaces 16a and 16b respectively. That is, the first polarization region 41 is below the interface 16a, the second polarization region 42 is above the interface 16a and below the interface 16b, and a third polarization region 43 is above the interface 16b. The first polarization region 41 is polarized downward, the second polarization region 42 is polarized upward, and the third polarization region 43 is polarized downward. The example in which one piezoelectric device includes two interfaces is described here, but one piezoelectric device may include three or more interfaces. In the example illustrated in FIG. 4, each of the interfaces 16a and 16b is on the same or substantially the same plane in the surface direction of the piezoelectric layer 10, but the configuration is not limited to this. That is, each of the interfaces 16a and 16b does not have to be entirely on the same plane. A portion of the interfaces 16a and 16b may be shifted in the thickness direction inside the piezoelectric layer 10.

Figure 5:
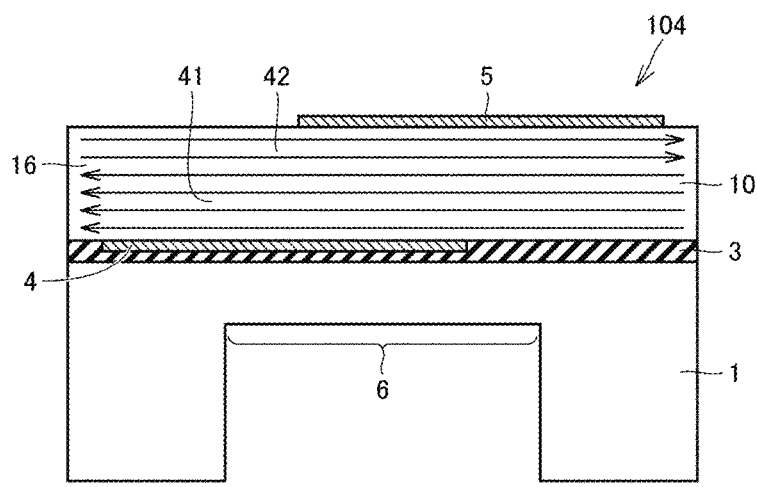
FIG. 5 is a sectional view of a third modification of the piezoelectric device according to Preferred Embodiment 1 of the present invention.

A piezoelectric device 104 illustrated in FIG. 5 may be provided. In the piezoelectric device 104, the direction of polarization inside the piezoelectric layer 10 is not the thickness direction of the piezoelectric layer 10 but a direction parallel or substantially parallel to the main surface of the piezoelectric layer 10 (in-plane direction). The interface 16 is in the middle of the thickness direction of the piezoelectric layer 10. In the piezoelectric device 104, the piezoelectric layer 10 includes the first polarization region 41 and the second polarization region 42. The first polarization region 41 below the interface 16 is polarized leftward in FIG. 5. The second polarization region 42 above the interface 16 is polarized rightward in FIG. 5. In the example illustrated in FIG. 5, the interface 16 is on the same or substantially the same plane in the surface direction of the piezoelectric layer 10, but the configuration is not limited to this. That is, the interface 16 does not have to be entirely on the same plane. A portion of the interface 16 may be shifted in the thickness direction inside the piezoelectric layer 10.

The direction of polarization in the piezoelectric layer 10 may be appropriately selected between the thickness direction and the direction parallel or substantially parallel to the main surface depending on a direction in which a piezoelectric body defining the piezoelectric layer 10 is cut out from a material lump.

Figure 6:
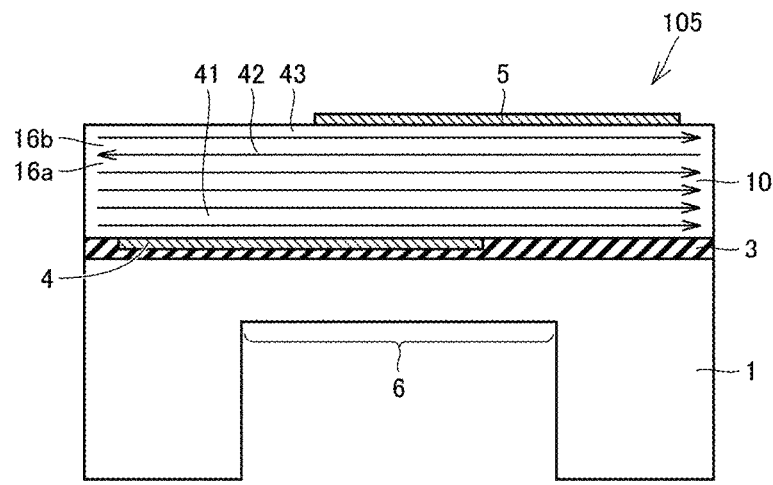
FIG. 6 is a sectional view of a fourth modification of the piezoelectric device according to Preferred Embodiment 1 of the present invention.

A piezoelectric device 105 illustrated in FIG. 6 may be provided. In the piezoelectric device 105, the direction of polarization inside the piezoelectric layer 10 is parallel or substantially parallel to the main surface of the piezoelectric layer 10. In addition to this, the piezoelectric layer 10 includes two interfaces 16a and 16b in the middle of the thickness direction of the piezoelectric layer 10. The piezoelectric layer 10 includes the first polarization region 41, the second polarization region 42, and the third polarization region 43. The first polarization region 41 below the interface 16a is polarized rightward in FIG. 6. The second polarization region 42 above the interface 16a and below the interface 16b is polarized leftward in FIG. 6. The third polarization region 43 above the interface 16b is polarized rightward in FIG. 6. In the example illustrated in FIG. 6, each of the interfaces 16a and 16b is on the same or substantially the same plane in the surface direction of the piezoelectric layer 10, but the configuration is not limited to this. That is, each of the interfaces 16a and 16b does not have to be entirely on the same plane. A portion of the interfaces 16a and 16b may be shifted in the thickness direction inside the piezoelectric layer 10.

Manufacturing Method

A method for manufacturing the piezoelectric device 101 according to the present preferred embodiment will be described with reference to FIGS. 7 to 11.

Figure 7:
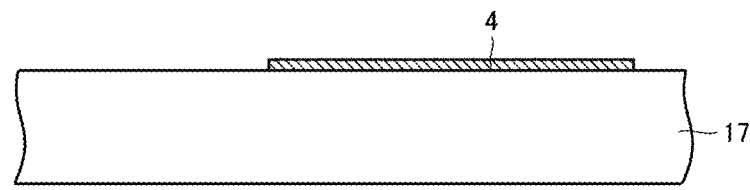
FIG. 7 is a diagram illustrating a first step of a method for manufacturing the piezoelectric device according to Preferred Embodiment 1 of the present invention.

A piezoelectric single crystal substrate 17 is first prepared as illustrated in FIG. 7. The piezoelectric single crystal substrate 17 may preferably be a substrate made of LiTaO$_3$ or LiNbO$_3$, for example. Then, the lower electrode 4 is formed by forming a film and is patterned to a desired shape on one surface of the piezoelectric single crystal substrate 17. The lower electrode 4 may preferably be made of Pt or the like, for example. At an interface between the piezoelectric single crystal substrate 17 and the lower electrode 4, a Ti layer or the like, for example, defining and functioning as an adhesion layer may preferably be interposed.

Figure 8:
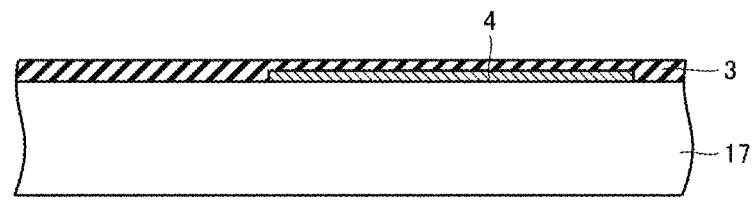
FIG. 8 is a diagram illustrating a second step of the method for manufacturing the piezoelectric device according to Preferred Embodiment 1 of the present invention.

As illustrated in FIG. 8, the intermediate layer 3 is formed to cover the lower electrode 4. The intermediate layer 3 may preferably be made of SiO$_2$ or the like, for example. After the intermediate layer 3 is formed, the surface of the intermediate layer 3 is planarized by, for example, chemical mechanical polishing (CMP).

Figure 9:
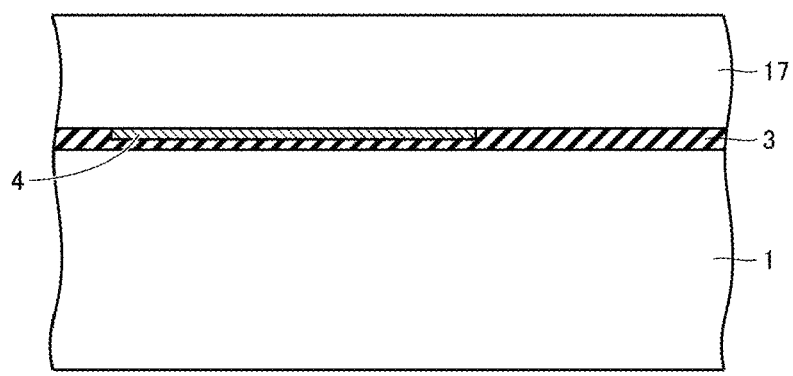
FIG. 9 is a diagram illustrating a third step of the method for manufacturing the piezoelectric device according to Preferred Embodiment 1 of the present invention.
Figure 10:
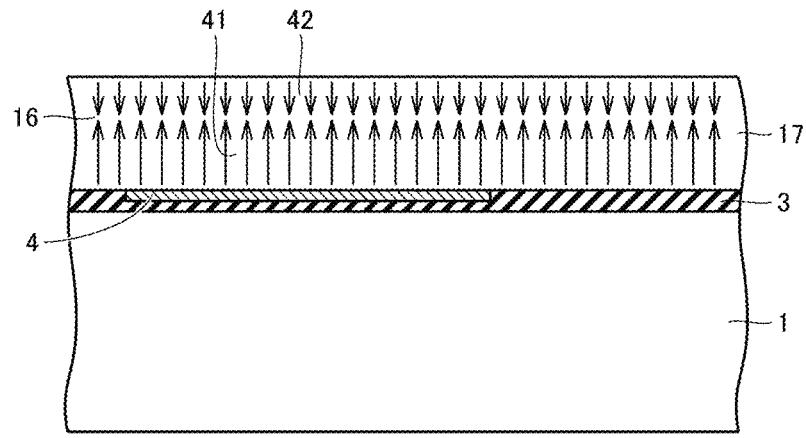
FIG. 10 is a diagram illustrating a fourth step of the method for manufacturing the piezoelectric device according to Preferred Embodiment 1 of the present invention.

This structure is bonded to the substrate 1 as illustrated in FIG. 9. The bonding is performed so that the intermediate layer 3 is in contact with the substrate 1. A metal layer may be interposed at an interface where the intermediate layer 3 and the substrate 1 are joined each other. The substrate 1 may preferably be, for example, a silicon substrate. An intermediate layer may also be disposed inside the substrate 1. The intermediate layer 3 may be formed, for example, by thermally oxidizing a portion of the substrate 1.

The piezoelectric single crystal substrate 17 is polished or peeled, or undergoes both steps of polishing and peeling, so as to be thinned to have a desired film thickness. Grinding, CMP, or the like, for example, may be used as a method for thinning, for polarization control, the piezoelectric single crystal substrate 17 through polishing. If the piezoelectric single crystal substrate 17 is thinned by peeling, a peeling layer is formed in advance in the piezoelectric single crystal substrate 17 by an ion implantation method. In this case, desired polarization can be obtained by controlling power, the depth, and the like in the ion implantation. Performing these processes induces polarization, and the first polarization region 41 and the second polarization region 42 are accordingly formed as illustrated, for example, in FIG. 10. Annealing may further be performed so as to restore crystallinity or control polarization.

Figure 11:
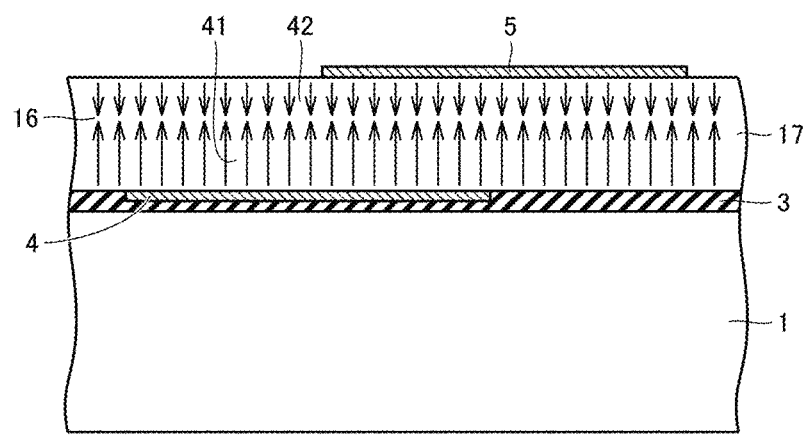
FIG. 11 is a diagram illustrating a fifth step of the method for manufacturing the piezoelectric device according to Preferred Embodiment 1 of the present invention.

As illustrated in FIG. 11, the upper electrode 5 is formed as a film and is patterned to a desired shape on the upper surface of the piezoelectric single crystal substrate 17. The upper electrode 5 may preferably be made of, for example, Pt or the like. A Ti layer or the like, for example, defining and functioning as an adhesion layer may preferably be interposed at an interface between the piezoelectric single crystal substrate 17 and the upper electrode 5.

The piezoelectric single crystal substrate 17, the intermediate layer 3, and the substrate 1 are patterned to a desired shape. A portion or an entirety of the substrate 1 are removed by, for example, deep reactive-ion etching (DRIE) so as to form the membrane portion 6. The intermediate layer 3 may be removed from the lower surface of the membrane portion 6 if desired. Thus, the piezoelectric device 101 illustrated in FIG. 1 can be obtained.

Preferred Embodiment 2

Figure 12:
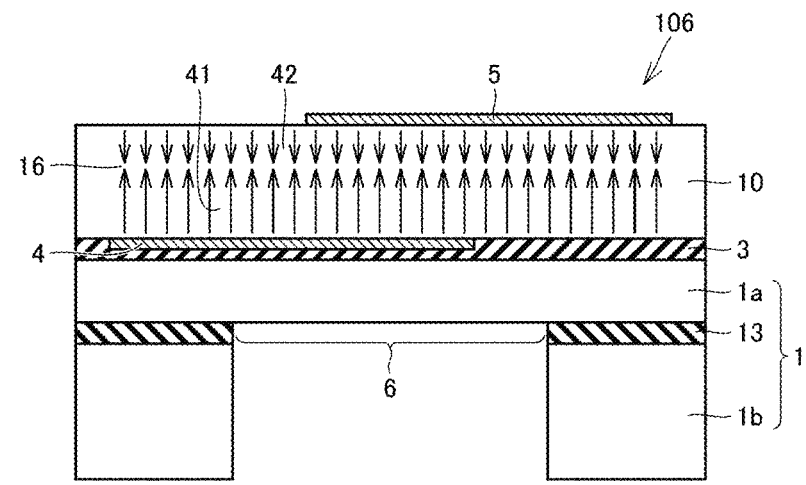
FIG. 12 is a sectional view of a piezoelectric device according to Preferred Embodiment 2 of the present invention.

A piezoelectric device 106 according to Preferred Embodiment 2 of the present invention will be described with reference to FIG. 12. In the piezoelectric device 106, a silicon-on-insulator (SOI) substrate is used as the substrate 1. The substrate 1 includes an active layer 1a and a foundation portion 1b and an insulating film 13 is interposed between the active layer 1a and the foundation portion 1b. The piezoelectric layer 10 is joined to the upper side of the active layer 1a with an intermediate layer 3 interposed therebetween. The remaining configuration is the same or substantially the same as that described in Preferred Embodiment 1.

In the present preferred embodiment, the piezoelectric layer 10 is able to efficiently strain by applying a potential difference between the upper electrode 5 and the lower electrode 4. A portion other than the piezoelectric layer 10 in the membrane portion 6 does not directly deform in response to the application of the potential difference. Only the piezoelectric layer 10 strains in the membrane portion 6, and consequently, the membrane portion 6 vibrates to bend up and down. The piezoelectric device 106 may be used as a PMUT, for example.

Preferred Embodiment 3

Figure 13:
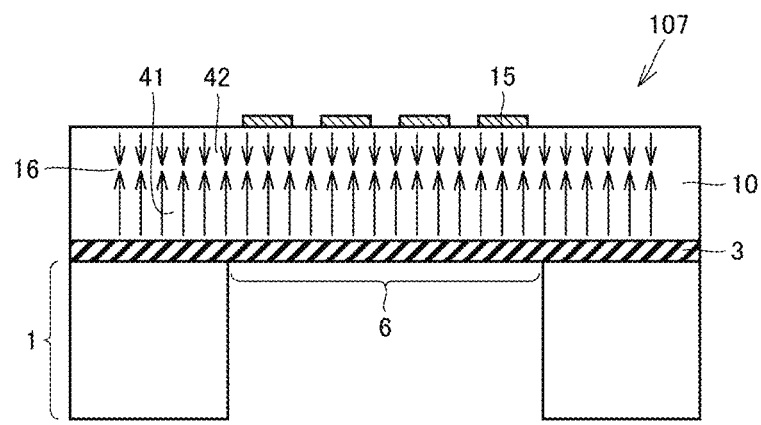
FIG. 13 is a sectional view of a piezoelectric device according to Preferred Embodiment 3 of the present invention.

A piezoelectric device 107 according to Preferred Embodiment 3 of the present invention will be described with reference to FIG. 13. In the piezoelectric device 107, a comb-shaped electrode 15 is disposed on the upper surface of the piezoelectric layer 10. A comb-shaped electrode is also called an interdigital transducer (IDT) electrode. The piezoelectric device 107 utilizes a plate wave. A Ti layer or the like, for example, defining and functioning as an adhesion layer may preferably be interposed between the piezoelectric layer 10 and the comb-shaped electrode 15. The "plate wave" here is a collective term of various waves that are excited at a piezoelectric thin plate having a 1λ or thinner film thickness when the wave length of a plate wave to be excited is set to about 1λ.

Device characteristics can also be improved in the present preferred embodiment. For example, a band width ratio is about 4.5% in the configuration in which a polarization state is not controlled, while the band width ratio is about 1.0% by applying the present preferred embodiment to control the polarization state.

The present preferred embodiment has described an example in which the piezoelectric device utilizes a plate wave, but the type of wave is not limited to this. The piezoelectric device may utilize a bulk wave, for example. In other words, the membrane portion 6 may utilize a plate wave or a bulk wave. Similar advantageous effects can be obtained in these cases as well.

Preferred Embodiment 4

Figure 14:
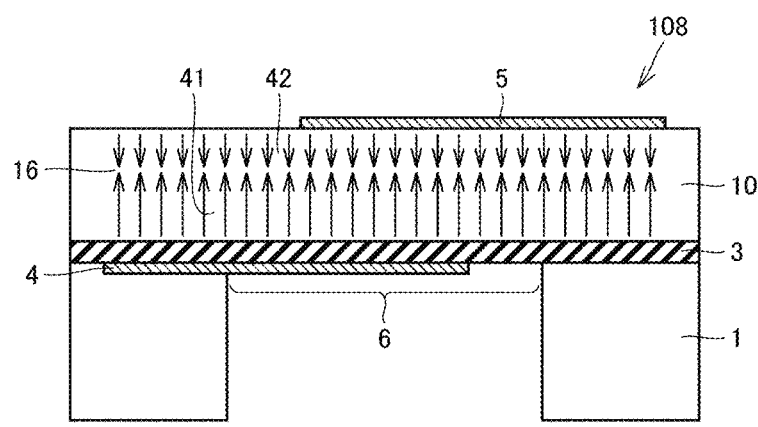
FIG. 14 is a sectional view of a piezoelectric device according to Preferred Embodiment 4 of the present invention.

A piezoelectric device 108 according to Preferred Embodiment 4 of the present invention will be described with reference to FIG. 14. In the piezoelectric device 108, the intermediate layer 3 is disposed on the lower surface of the piezoelectric layer 10. The substrate 1 is bonded to the lower side of the intermediate layer 3. The intermediate layer 3 is exposed to a portion of the lower surface of the membrane portion 6. The lower electrode 4 is exposed to another portion of the lower surface of the membrane portion 6.

Advantageous effects the same as or similar to those of Preferred Embodiment 1 can also be obtained in the present preferred embodiment.

Figure 15:
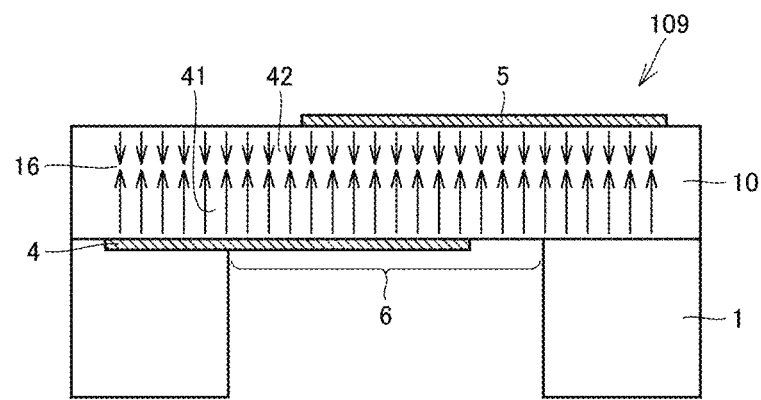
FIG. 15 is a sectional view of a modification of the piezoelectric device according to Preferred Embodiment 4 of the present invention.

Here, the configuration illustrated in FIG. 15 can be provided as a modification of the present preferred embodiment. The intermediate layer 3 is not included in a piezoelectric device 109 illustrated in FIG. 15. The piezoelectric layer 10 is directly bonded to the upper surface of the substrate 1. In the piezoelectric device 109, the piezoelectric layer 10 is exposed to a portion of the lower surface of the membrane portion 6. The lower electrode 4 is exposed to another portion of the lower surface of the membrane portion 6.

Figure 16:
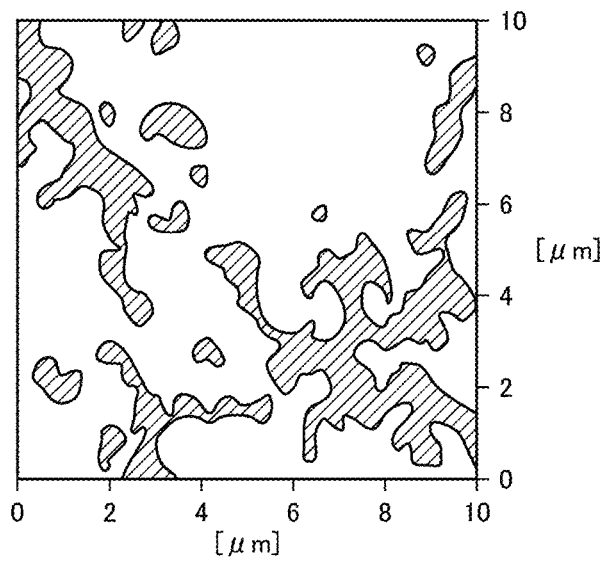
FIG. 16 is a diagram illustrating an example in which two kinds of regions whose directions of polarization are opposite to each other are mixed in one surface of a piezoelectric layer.

In the preferred embodiments described above, a direction of polarization can be changed depending on a position in one plane of the piezoelectric layer 10 by controlling a polarization state through polishing, peeling, ion implantation, and the like, for example. Directions of polarization can be different from each other depending on the depth from the surface, and directions of polarization can also be different from each other depending on a position in a plan view. FIG. 16 illustrates an example in which two kinds of regions whose directions of polarization are opposite to each other are mixed in one plane of the piezoelectric layer 10. In FIG. 16, white regions represent "+" polarity, while hatched regions represent "−" polarity.

Preferred Embodiment 5

Figure 17:
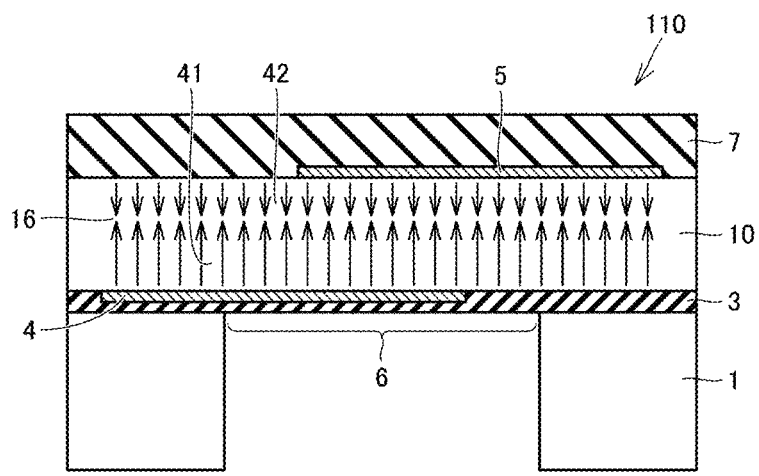
FIG. 17 is a sectional view of a piezoelectric device according to Preferred Embodiment 5 of the present invention.

A piezoelectric device 110 according to Preferred Embodiment 5 of the present invention will be described with reference to FIG. 17. In the piezoelectric device 110, a supporting film 7 covers the upper side of the piezoelectric layer 10. The supporting film 7 may preferably be made of any material selected from SiN, $SiO_2$, AlN, ZnO, $Ta_2O_5$, and the like, for example. The supporting film 7, the piezoelectric layer 10, and the intermediate layer 3 may be patterned to each have a desired shape in a plan view. In the piezoelectric device 110 according to the present preferred embodiment, the membrane portion 6 includes the supporting film 7 which is disposed to cover one surface of the piezoelectric layer 10, and the supporting film 7 and the piezoelectric layer 10 integrally vibrate in the membrane portion 6.

In the present preferred embodiment, the piezoelectric layer 10 is able to strain by applying a potential difference between the upper electrode 5 and the lower electrode 4. A portion other than the piezoelectric layer 10 in the membrane portion 6 does not directly deform in response to the application of the potential difference. Only the piezoelectric layer 10 in the membrane portion 6 strains and consequently, the membrane portion 6 vibrates to bend up and down.

Here, when the piezoelectric layer 10 includes polarization regions whose directions are different from each other, device characteristics might be deteriorated depending on application of the device. In FIG. 1, for example, the first polarization region 41 might deteriorate the device characteristics in the piezoelectric layer 10 including the first polarization region 41 and the second polarization region 42.

This case requires a configuration to reduce or prevent deterioration in the device characteristics due to the first polarization region 41.

In this case, such a configuration as the piezoelectric device 110 may be provided. Specifically, the piezoelectric device 110 including the membrane portion 6 includes the piezoelectric layer 10 made of single crystal of a piezoelectric body, at least a portion of the piezoelectric layer 10 is included in the membrane portion 6, the electrode 5 is provided on the surface of the piezoelectric layer 10 in the membrane portion 6, the piezoelectric layer 10 includes the first polarization region 41 in the first polarization state and the second polarization region 42 in the second polarization state, and the supporting film 7 is provided on the first polarization region 41.

Figure 18:
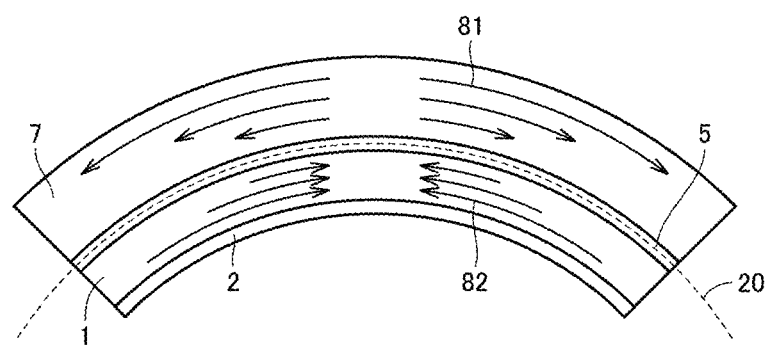
FIG. 18 is a diagram illustrating in-plane stress in a membrane portion of the piezoelectric device according to Preferred Embodiment 5 of the present invention.

When the supporting film 7 is provided, a neutral plane of the membrane portion 6 exists around the first polarization region 41. FIG. 18 illustrates in-plane stress in the membrane portion 6. When attention is paid to the vicinity of a neutral plane 20, internal tensile stress as illustrated with arrows 81 is generated on the outer peripheral side with respect to the neutral plane 20. On the inner peripheral side with respect to the neutral plane 20, internal compression stress as illustrated with arrows 82 is generated. In-plane stress is small at positions close to the neutral plane 20. Accordingly, the contribution to deformation of the piezoelectric layer 10 is low.

Here, the neutral plane 20 may pass through the inside of the first polarization region 41.

As described in the present preferred embodiment, the first polarization region 41 and the second polarization region 42 are preferably spaced apart from each other in the thickness direction and a boundary between the first polarization region 41 and the second polarization region 42 is preferably positioned close to the supporting film 7 in the thickness direction inside the piezoelectric layer 10 included in the membrane portion 6.

The first polarization region 41 and the second polarization region 42 are preferably provided in the same piezoelectric layer 10 as described in the present preferred embodiment. In this case, the first polarization region 41 and the second polarization region 42 exist inside a single crystal piezoelectric body.

Here, two or more preferred embodiments described above may be appropriately combined and used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
   a membrane portion; and
   a piezoelectric layer; wherein
   at least a portion of the piezoelectric layer is included in the membrane portion;
   an electrode is provided on a surface of the piezoelectric layer in the membrane portion;
   the piezoelectric layer is a single layer that includes a first polarization region in a first polarization state and a second polarization region in a second polarization state; and
   the first polarization region and the second polarization region are spaced apart from each other in a thickness direction or an in-plane direction.

2. The piezoelectric device according to claim 1, wherein directions of polarization in the first polarization state and the second polarization state are opposite to each other.

3. The piezoelectric device according to claim 1, wherein the first polarization region and the second polarization region are spaced apart from each other in the thickness direction of the piezoelectric layer and an interface between the first polarization region and the second polarization region is close to the electrode.

4. The piezoelectric device according to claim 1, wherein the piezoelectric body is $LiTaO_3$ or $LiNbO_3$.

5. The piezoelectric device according to claim 1, wherein the membrane portion is structured to perform flexural vibration.

6. The piezoelectric device according to claim 1, wherein the membrane portion utilizes a plate wave or a bulk wave.

7. The piezoelectric device according to claim 5, wherein the membrane portion includes a supporting film covering one surface of the piezoelectric layer, and the supporting film and the piezoelectric layer integrally vibrate in the membrane portion.

8. The piezoelectric device according to claim 7, wherein the first polarization region and the second polarization region are spaced apart from each other in the thickness direction and a boundary between the first polarization region and the second polarization region is closer to the one surface of the piezoelectric layer covered by the supporting film than to another surface of the piezoelectric layer opposite to the one surface in the thickness direction inside the piezoelectric layer included in the membrane portion.

9. The piezoelectric device according to claim 1, wherein the first polarization region and the second polarization region are provided in a same piezoelectric layer.

10. The piezoelectric device according to claim 1, wherein the piezoelectric layer is made of a single crystal of a piezoelectric body.

11. The piezoelectric device according to claim 1, further comprising a third polarization region spaced apart from the first and second polarization regions in the thickness direction or the in-plane direction.

12. The piezoelectric device according to claim 3, wherein the interface is on a same or substantially on a same plane.

13. The piezoelectric device according to claim 1, further comprising a substrate on which the piezoelectric layer is disposed.

14. The piezoelectric device according to claim 1, wherein
   the substrate includes a thin portion and a thick portion; and
   the membrane portion includes the thin portion.

15. The piezoelectric device according to claim 14, wherein the thin portion is surrounded by the thick portion.

16. The piezoelectric device according to claim 13, further comprising an intermediate layer between the substrate and the piezoelectric layer.

17. The piezoelectric device according to claim 16, wherein the intermediate layer is made of $SiO_2$.

18. The piezoelectric device according to claim 1, wherein the membrane portion has a circular or substantially circular shape.

\* \* \* \* \*